United States Patent
Kobayashi et al.

(10) Patent No.: US 7,161,222 B2
(45) Date of Patent: Jan. 9, 2007

(54) SEMICONDUCTOR DEVICE AND SEMICONDUCTOR DEVICE FABRICATION METHOD

(75) Inventors: Motoki Kobayashi, Kanagawa (JP); Fumio Ichikawa, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/673,499

(22) Filed: Sep. 30, 2003

(65) Prior Publication Data

US 2004/0159888 A1 Aug. 19, 2004

(30) Foreign Application Priority Data

Feb. 18, 2003 (JP) .............................. 2003-040333

(51) Int. Cl.
*H01L 31/00* (2006.01)
*H01L 27/12* (2006.01)
*H01L 29/06* (2006.01)

(52) U.S. Cl. .................... 257/460; 257/447; 257/347; 257/622

(58) Field of Classification Search ................ 257/447, 257/460
See application file for complete search history.

(56) References Cited

U.S. PATENT DOCUMENTS 5,530,266 A * 6/1996 Yonehara et al. ............. 257/72
5,668,057 A * 9/1997 Eda et al. .................... 438/113
6,229,165 B1 * 5/2001 Sakai et al. .................. 257/291
6,583,445 B1 * 6/2003 Reedy et al. .................. 257/82

FOREIGN PATENT DOCUMENTS

| JP | 09-270515 | 10/1997 |
| JP | 10-098200 | 4/1998 |
| JP | 10-135487 | 5/1998 |
| JP | 2001-308667 | 11/2001 |

* cited by examiner

*Primary Examiner*—Zandra V. Smith
*Assistant Examiner*—Kiesha Rose
(74) *Attorney, Agent, or Firm*—Rabin & Berdo, PC

(57) ABSTRACT

An SOI layer is formed on a substrate of a semiconductor device, and one or more elements are formed on the SOI layer. One or more grooves are formed in a substrate of the semiconductor device by removing part of the substrate. The groove is formed directly below an element for which dielectric loss caused by the substrate is assumed. Because silicon crystal constituting a dielectric is only present thinly at the groove or is completely absent therefrom, the dielectric loss of the element located above this groove is then very small. If this element is a constituent element of a high frequency circuit, the high frequency circuit thus displays high responsiveness and stability with respect to high frequency signal processing.

20 Claims, 7 Drawing Sheets

100 : SEMICONDUCTOR DEVICE

200 : SEMICONDUCTOR DEVICE

200 : SEMICONDUCTOR DEVICE

300 : SEMICONDUCTOR DEVICE

300 : SEMICONDUCTOR DEVICE

SEMICONDUCTOR DEVICE AND SEMICONDUCTOR DEVICE FABRICATION METHOD

BACKGROUND OF THE INVENTION

1. Field of the Invention

The present invention relates to a semiconductor device and a semiconductor device fabrication method.

2. Description of the Related Art

At present, expectations are high with regard to the SOI (Silicon On Insulator) technique that involves forming a silicon layer on an insulation layer and forming electronic elements such as transistors on the silicon film. This is one technique for implementing low electrical power consumption and high speed operability of a semiconductor device. The introduction of the SOI technique to semiconductor products is being actively pursued. This insulation film is formed on a support substrate and is known as a BOX (Buried OXide) layer. The silicon film formed on the BOX layer is called the SOI layer. When a semiconductor substrate (SOI substrate) is made using the SOI technique, a marked reduction in the power consumption is realized compared with an ordinary silicon substrate (bulk-type substrate). In addition, the SOI substrate possesses a favorable high frequency characteristic so that the SOI substrate is widely adopted in semiconductor devices that have an analog circuit operating on high frequency bandwidth signals or an analog-digital hybrid circuit, for example.

Although a certain improvement with respect to the parasitic capacitance of the substrate may be seen in the high frequency circuit as a result of applying the SOI technique, there is a greater need for a reduction in the element dielectric loss caused by the substrate because, in current technology the frequency bandwidth of transmission signals often reaches the Gigahertz (GHz) range.

Japanese Patent Kokai (Laid Open Publication) No. 9-270515 discloses a technique for reducing the parasitic capacitance between the substrate and an element (inductor) of a semiconductor device that includes an SOI layer.

According to the semiconductor device described in Japanese Patent Kokai No. 9-270515, the SOI layer and an element isolation oxide film are formed on a BOX layer, and the inductor is disposed on the element isolation oxide film. On account of the small parasitic capacitance, not only does the element isolation oxide film prevent the generation of element dielectric loss, the film also fulfils the role of alleviating the dielectric loss of the inductor which is caused by the substrate.

The conventional technique needs to form an element, for which a dielectric loss reduction is sought, on a predetermined film such as an element isolation oxide film. This technique imposes restrictions on the layout, quantity and type of the elements for which the dielectric loss reduction is sought. Further, if the element isolation oxide film is formed thickly, the effect of the element dielectric loss reduction is large, but a corresponding difference in level (height) is produced between the region in which the element isolation oxide film is formed and another region. This difference in level will adversely affect the subsequent fabrication process.

SUMMARY OF THE INVENTION

One object of the present invention is to provide a new and improved semiconductor device and semiconductor device fabrication method which permit a further reduction of the dielectric loss of an element formed on an SOI layer without dependence on a film with a small parasitic capacitance such as an element isolation oxide film.

According to a first aspect of the present invention, there is provided a semiconductor device which includes a substrate, an insulation layer formed on the substrate, and an SOI layer formed on the insulation layer. The semiconductor device also includes a plurality of elements formed on the SOI layer. A groove is formed in the substrate such that the groove is located below a target element whose dielectric loss is to be controlled among the elements formed on the SOI layer. By forming the groove in the substrate below the target element, the substrate with a high dielectric constant is no longer present below the target element. In addition, the support substrate is made thin locally below the target element. As a result, the dielectric loss of the target element decreases. If there are two or more target elements, one groove may be formed below each target element, or one relatively large groove may be formed below a group of target elements.

Because the support substrate includes the groove(s) at the desired position(s), the dielectric loss of the target element(s) formed on the SOI layer can be kept to a minimum. When reducing the dielectric loss of the target element(s), no restrictions are imposed by the position(s) of the target element(s). That is, the dielectric loss of an element disposed at any location in the semiconductor device can be reduced by forming a groove in the support substrate below this element.

According to a second aspect of the present invention, there is provided a method for fabricating a semiconductor device. The semiconductor device includes a substrate, an insulation layer formed on the substrate, an SOI layer formed on the insulation layer, and a plurality of elements formed on the SOI layer. The semiconductor device fabrication method includes the step of selecting one or more target elements whose dielectric loss is to be controlled from among the elements formed on the SOI layer. The fabrication method also includes the step of forming one or more grooves in the substrate in an area (areas) located below the one or more target elements thus selected. By forming the groove(s) in the substrate below the target element(s), the support substrate with a high dielectric constant is no longer present below the target element(s). Further, the substrate is made locally thin below the target element(s). Thus, it is possible to selectively reduce the dielectric loss for a certain target element requiring a reduction in dielectric loss from among the elements formed on the SOI layer.

Because the groove is formed in the support substrate, a semiconductor device that includes elements with reduced dielectric loss may be fabricated. The target element(s) can be determined arbitrarily from the elements belonging to the semiconductor device, and the dielectric loss of the target element(s) can be easily reduced.

DETAILED DESCRIPTION OF THE INVENTION

Figure 1:
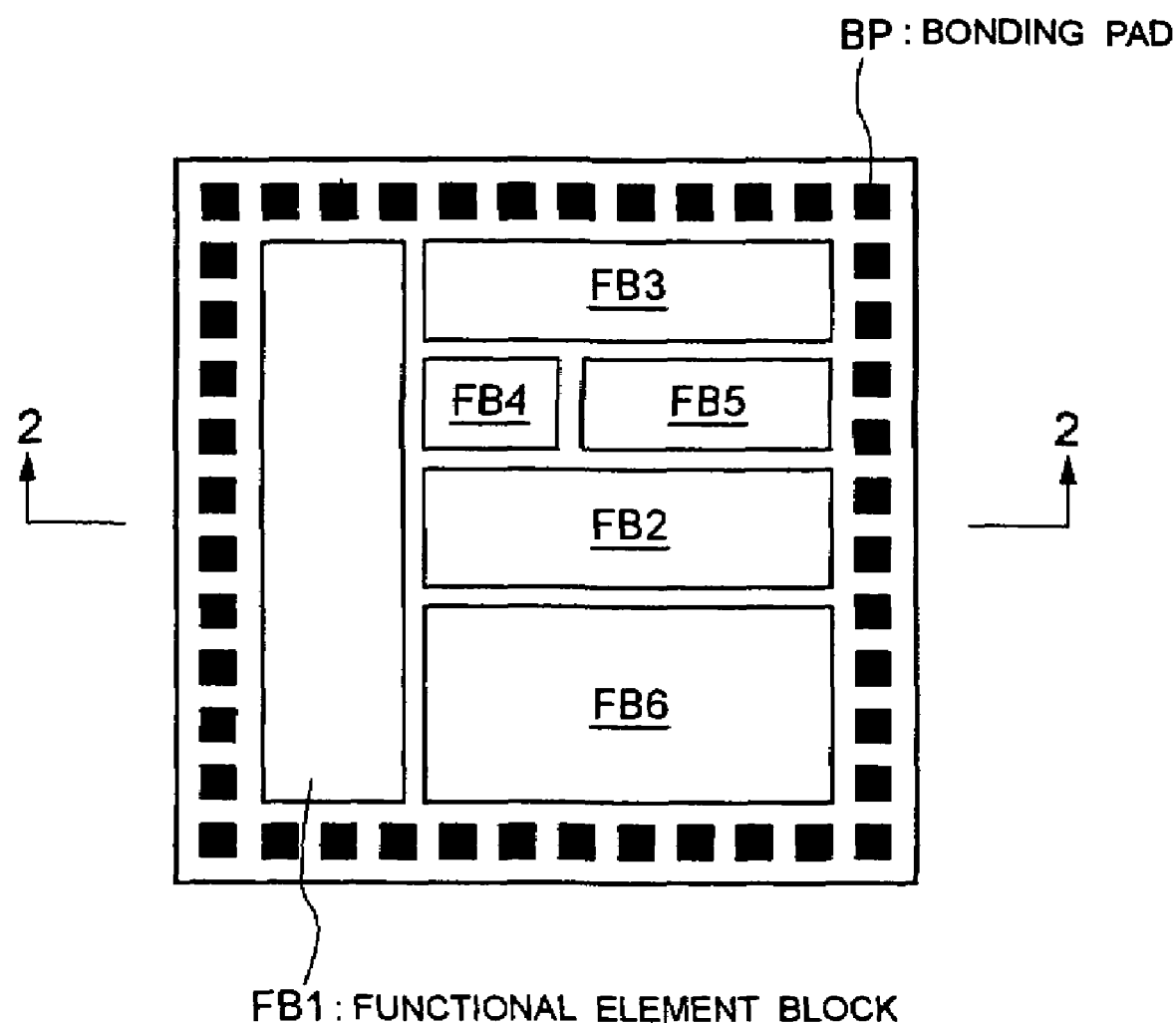
FIG. 1 is a schematic plan view of a semiconductor device according to a first embodiment of the present embodiment.

Embodiments of the semiconductor device and semiconductor device fabrication method according to the present invention will be described in detail below with reference to the attached drawings. Those elements in the following description and the attached drawings which have similar function and constitution are assigned the same reference numerals so as to avoid repeated description.

FIRST EMBODIMENT

Referring to FIG. 1, a semiconductor device 100 according to the first embodiment of the present embodiment will be described.

The semiconductor device 100 includes a plurality of elements such as transistors and a variety of analog elements. The elements are grouped by function and, as shown in FIG. 1, form functional element blocks FB1 to FB6. For example, the functional element block FB1 is a high frequency circuit block, the functional element block FB2 is a digital signal processing circuit block, and the function block FB3 is a supply circuit block. Of course, other ways of grouping may be possible, depending upon a design of the semiconductor device 100. A plurality of bonding pads BP for the input and output of electrical signals externally of the semiconductor device 100 are arranged at the fringe or periphery of the upper surface of the semiconductor device 100.

Figure 2:
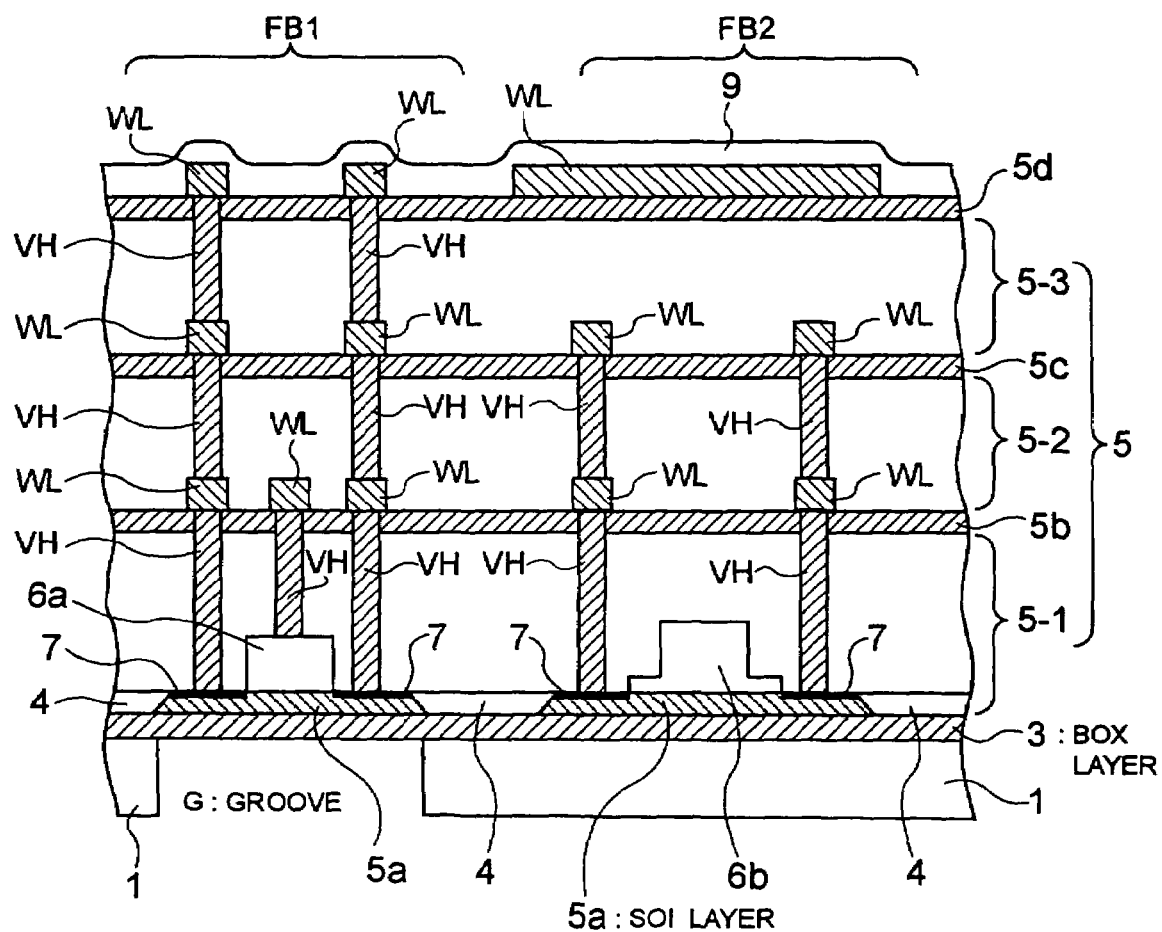
FIG. 2 illustrates a cross-sectional view of the semiconductor device of FIG. 1, taken along the line 2—2 in FIG. 1.

Referring to FIG. 2, the internal structure of the semiconductor device 100 will be described. The semiconductor device 100 of this embodiment for which the SOI technique is adopted includes a support substrate 1, a BOX layer 3 on the support substrate 1, and an SOI layer 5a on the BOX layer 3. The BOX layer 3 is an insulation layer. The SOI layer 5a is made from silicon. A variety of elements such as transistors, capacitors, inductors, and resistive elements are formed on the SOI layer 5a. An element isolation layer 4 is also formed on the BOX layer 3 such that regions in which the elements are formed are electrically isolated from each other by the element isolation layer 4. That is, the elements are enclosed by the BOX layer 3 and the element isolation layer 4 that exhibit high electrical insulation characteristics. As a result of this constitution, the electrical influence exerted on the elements by the support substrate 1 and the peripheral region is alleviated and hence the operation of the elements is stabilized.

The SOI layer 5a formed on the BOX layer 3 and the elements formed on the SOI layer 5a constitute a first element formation layer 5-1 in the semiconductor device 100. A second element formation layer 5-2 and a third element formation layer 5-3 which are formed with a plurality of elements are stacked sequentially on the element formation layer 5-1. Thus, the semiconductor device 100 according to the present embodiment includes an element formation layer group 5 which is constituted by a plurality of element formation layers. In other words, the semiconductor device 100 has a stacked structure. As shown in FIG. 2, a plurality of wiring WL is formed in the uppermost portion of the stacked structure, that is, in the surface portion of the semiconductor device 100. The bonding pads BP (FIG. 1) are also arranged in the surface portion of the semiconductor device 100 (not shown in FIG. 2). With the exception of the region in which the bonding pads BP are formed, the surface of the semiconductor device 100 is covered by a passivation film 9 that exhibits superior moisture prevention. It should be noted that the quantity of stacked element formation layers is not restricted to the quantity shown in FIG. 2 and may be increased or decreased in accordance with the specifications of the semiconductor device.

In this embodiment, a silicon substrate is used as the support substrate 1. The BOX layer 3 is formed using, for example, a method for oxidizing the surface of the support substrate 1 or a method for laminating an insulation film which is fabricated separately on the support substrate 1. The BOX layer 3 possesses high insulation characteristics and suppresses parasitic capacitance which is generated between the upper elements and the support substrate 1. This function of the BOX layer 3 makes it possible to reduce the electric power consumption of the semiconductor device 100 and increase the operation speed of the semiconductor device 100.

The element formation layers 5-1 to 5-3 which constitute the element formation layer group 5 are electrically isolated from one another by insulation films 5b, 5c, and 5d. As described above, a variety of elements such as transistors, capacitors, inductors and resistive elements are formed in the element formation layers 5-1 to 5-3 and the wiring WL that electrically connects these elements is formed. Although FIG. 2 shows only a transistor 6a which represents a variety of elements in the functional element block FB1, in reality, a plurality of other elements is formed. Likewise, a plurality of various elements 6b that includes a transistor is also formed in the functional element block FB2.

The wiring WL and the various elements such as the transistor 6a which are formed in the element function layers 5-1 to 5-3 are electrically linked in a predetermined pattern by means of via holes VH. The transistor 6a includes silicide 7 in the locations in which the transistor 6a is connected to the via holes VH. A reduction in the contact resistance between the metal in the via holes VH and the semiconductor forming the transistor 6a is achieved by the silicide 7. Preferably, the elements other than the transistor 6a also have the silicide 7 which reduces the contact resistance with the metal in the via holes VH, depending upon the constitution and function of these elements.

As described above, the elements such as the transistor 6a which are formed on the SOI layer 5a are electrically isolated from the support substrate 1 due to the presence of the BOX layer 3 which functions as an insulation layer, whereby the parasitic capacitance between the support substrate 1 and the elements is reduced.

Figure 3:
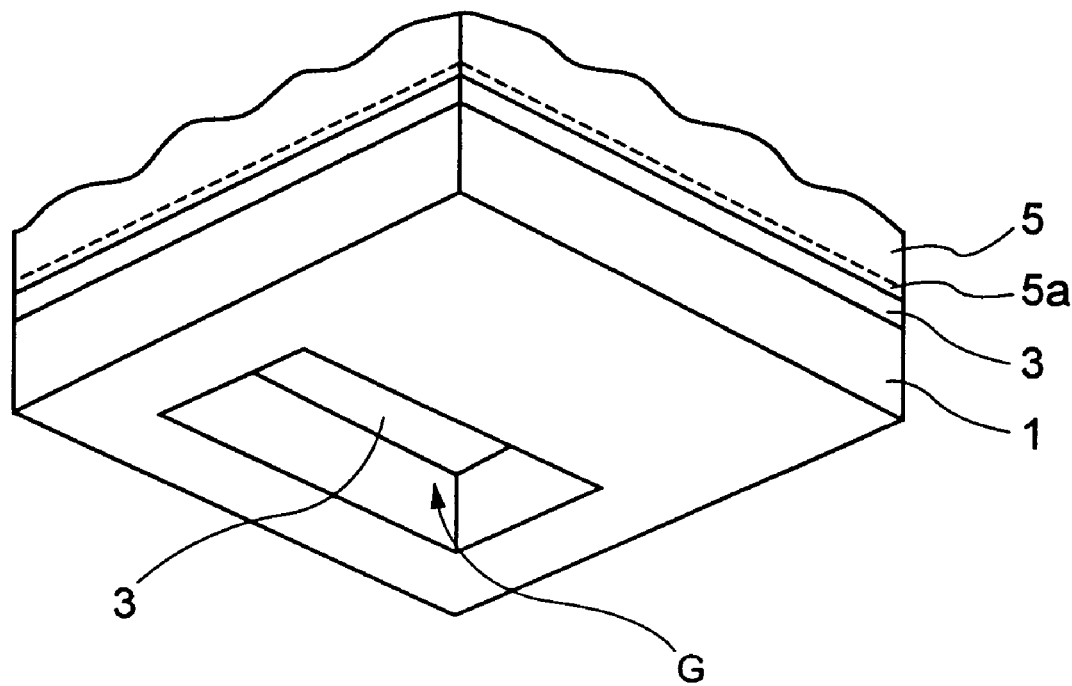
FIG. 3 illustrates a schematic perspective view of the semiconductor device of FIG. 1 when viewed from the back side of the semiconductor device.

However, in a case where, of the functional element blocks FB1 to FB6, the functional element block FB1, for example, is a high frequency circuit block, the dielectric loss of the elements belonging to the functional element block FB1 is preferably further reduced in order to allow the operation of these elements to follow a signal of a high frequency bandwidth. In this respect, according to the semiconductor device 100 of the present embodiment, as shown in FIGS. 2 and 3, the support substrate 1 includes a groove G and this groove G contributes to a reduction in the dielectric loss of the elements. The groove G will be described in detail below.

FIG. 3 is a perspective view of the semiconductor device 100 when the semiconductor device 100 is viewed from the reverse face (back face) side. The groove G is created by making the thickness of the support substrate 1 in a predetermined region thinner than in other regions or by establishing a state in which there is a complete absence of silicon crystal in a predetermined region of the support substrate 1. In the latter case, the reverse face of the BOX layer 3 is exposed by the groove G.

The groove G is formed so as to be located below (preferably directly below) an element for which dielectric loss caused by the support substrate 1 is assumed. Hereinafter, a certain element for which dielectric loss is assumed and which requires control for reducing dielectric loss is called a 'target element'. An analog element such as an inductor that constitutes a high frequency circuit is given here as a representative example of a target element. In the semiconductor device 100, because the functional element block FB1 is a high frequency circuit block that includes a plurality of target elements, the size and position of the groove G is determined so that the groove G is located below the functional element block FB1.

Because silicon crystal constituting a dielectric is only thinly present at the groove G or is completely absent at the groove G, the dielectric loss of the target element located above the groove G is very small. If this target element is a constituent element of a high frequency circuit, the high frequency circuit displays high responsiveness and stability with respect to high frequency signal processing.

Further, because the groove G is formed in the reverse face side of the support substrate 1, the groove G can be formed even after the fabrication process for the support substrate 1 has been completely finished. In addition, parts which represent an obstacle to the formation of the groove G are generally not present on the reverse face of the support substrate 1. For this reason, the formation of the groove G in accordance with the position of the target element is easy regardless of the position of the target element in the semiconductor device 100. That is, according to the semiconductor device 100, the dielectric loss of the target element can be reduced without being influenced by the position of the target element.

When target elements for which dielectric loss is to be reduced are dispersed through the whole of the device, the total area for forming the groove(s) G increases. In this case also, the groove G is preferably not formed at least directly below the bonding pads BP. Wire bonding performed on the bonding pads BP exerts the largest amount of mechanical stress on the semiconductor device. In this respect, by placing (leaving) the support substrate 1 below the bonding pads BP (not forming the groove G), a situation where the device is damaged by the wire bonding processing is avoided.

The fabrication method of the semiconductor device 100 according to the present embodiment will be described next by using FIGS. 1 to 5.

An SOI substrate is prepared by sequentially stacking the BOX layer 3 and the SOI layer 5a on the support substrate 1. Then, various steps are executed to form the circuit of the first element formation layer 5-1, which include a step of implanting impurities into the SOI layer 5a, a step of performing thermal processing, a step of growing a thin film for forming a variety of elements on the SOI layer 5a, and a step of partially removing the thin film by using photolithography. Thereafter, the same process is repeated to sequentially form the second element formation layer and subsequent element formation layer. The insulation films 5b, 5c, and 5d which serve to electrically isolate the element formation layers are grown between the element formation layers As a result, the element formation layer group 5 shown in FIG. 2 is finished. When the fabrication process of the element formation layer group 5 is concerned, a general semiconductor fabrication process can be applied so that a detailed description thereof is omitted here.

Figure 4:
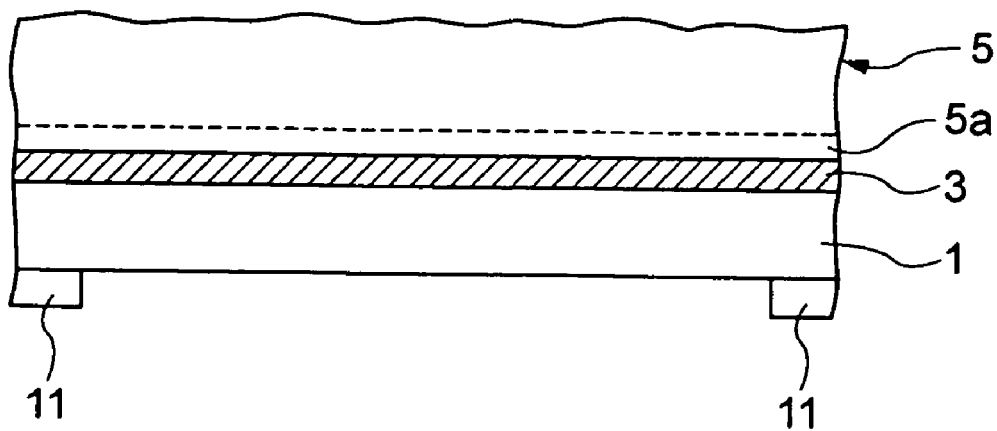
FIG. 4 illustrates a vertical sectional view of the semiconductor device of FIG. 1 at a certain fabrication process.

Next, as shown in FIG. 4, an etching mask 11 is formed on the exposed face of the support substrate 1 (the reverse face of the semiconductor device 100). Photolithography is preferably employed for the patterning of the etching mask 11. It should be noted, however, that the etching mask 11 can be formed by applying a pre-patterned mask member onto the surface of the support substrate 1.

As the material of the etching mask 11, either an organic material which is represented by a resist or an inorganic material such as silicon oxide can be used.

Figure 5:
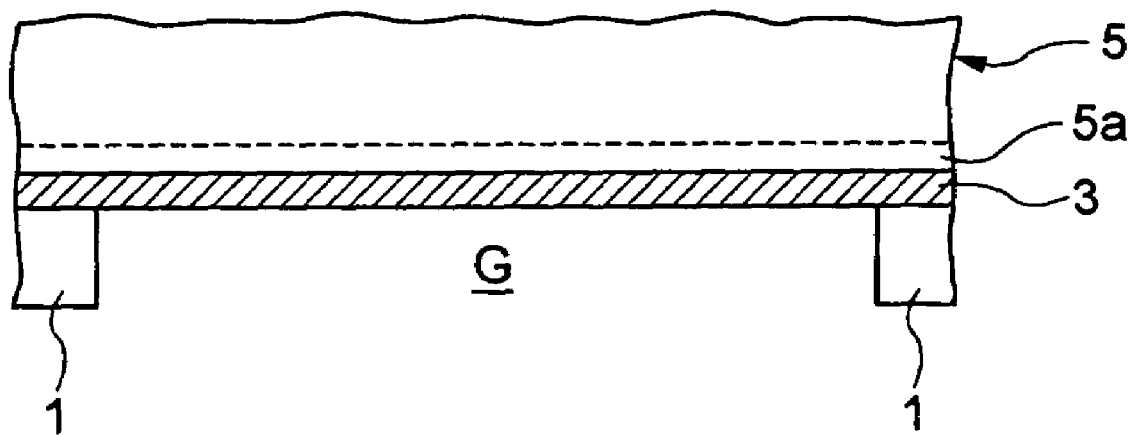
FIG. 5 illustrates another vertical sectional view of the semiconductor device of FIG. 1, to particularly show a structure of a support substrate of the semiconductor device after the process of FIG. 4.
Figure 5A:
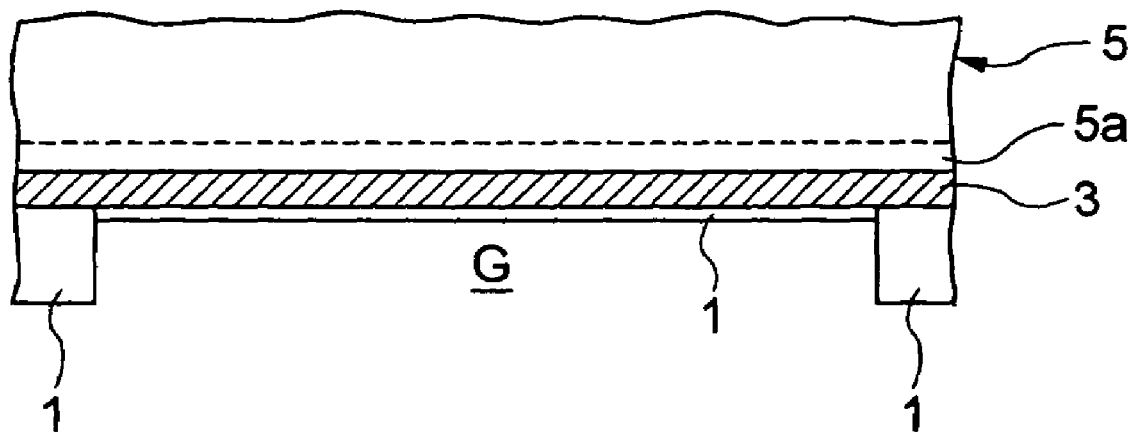
FIG. 5A is similar to FIG. 5, and shows the vertical sectional view of the semiconductor device of FIG. 1 when a BOX layer is not exposed after the process of FIG. 4.

Next, all or part of the support substrate 1 in the area not covered by the etching mask 11 is removed as shown in FIG. 5 or 5A. As a result, the groove G is formed. When the support substrate 1 in the area in which the groove G is formed is completely removed (FIG. 5), the BOX layer 3 is exposed at the bottom of the groove G. When only part of the support substrate 1 is removed (FIG. 5A), the support substrate 1 is left thin at the bottom of the groove G. Dry etching or wet etching is used in this process. Either form of etching may be selected in accordance with the etching treatment accuracy required, the material which forms the semiconductor device 100 and the specifications of the semiconductor fabrication device, and so forth.

With dry etching using plasma (plasma dry etching), high treatment accuracy is obtained. When part of the support substrate 1 is removed and the removal area must be strictly controlled, the plasma dry etching is adopted. In this dry etching, an RIE (Reactive Ion Etching) process based on $SF_6$ gas is employed. Silicon is etched at high speed (10 μm/min, for example) by using a high density plasma source. As a result of this etching, the etching speed of the silicon oxide film is kept equal to or less than $1/100$ of the etching speed of the silicon film. Therefore, as shown in FIG. 5, a predetermined area of the support substrate 1 can be removed while the BOX layer 3 remains. An example of the conditions for the dry etching is shown below.

Device: Alcatel 601E
Gas: $SF_6/C_4F_8$
Gas pressure: from several mTorr to several tens of mTorr
Source power: 1500 W The wet etching can also remove a predetermined area of the support substrate 1, as shown in FIG. 5, similarly to the case where the dry etching is used. With the wet etching, the etching rate of the silicon oxide film is kept equal to or less than 1/1000 of the etching speed of the silicon film. Therefore, after the BOX layer 3 is exposed as a result of part of the support substrate 1 being removed through etching, the etching process can be finished with barely any reduction of the exposed surface of the BOX layer 3.

In the wet etching, an alkali metal hydroxide which is represented by potassium hydroxide (KOH) aqueous solution, or a mixture of ethylenediamine, pyrocatechol and water is adopted as the chemical. An example of the wet etching conditions is shown below.

Chemical: KOH
Chemical concentration: 10%
Chemical temperature: 65° C.

The shape of the etching mask 11, that is, the position of the groove G in the support substrate 1 is determined in accordance with the position of the target element among the elements formed in the element formation layer group 5. By removing the support substrate 1 which is located below the target element by means of etching and thus forming the groove G, it is possible to reduce the dielectric loss of the target element caused by the support substrate 1 to a level negligible with respect to the specifications of the semiconductor device 100.

SECOND EMBODIMENT

A fabrication method for a semiconductor device 200 according to a second embodiment of the present invention will be described with reference to FIGS. 6 and 7. The semiconductor device 200 includes a plurality of elements. This fabrication method is particularly suitable for a case where the dielectric loss of an analog element, such as an inductor, among the elements is reduced.

Figure 6:
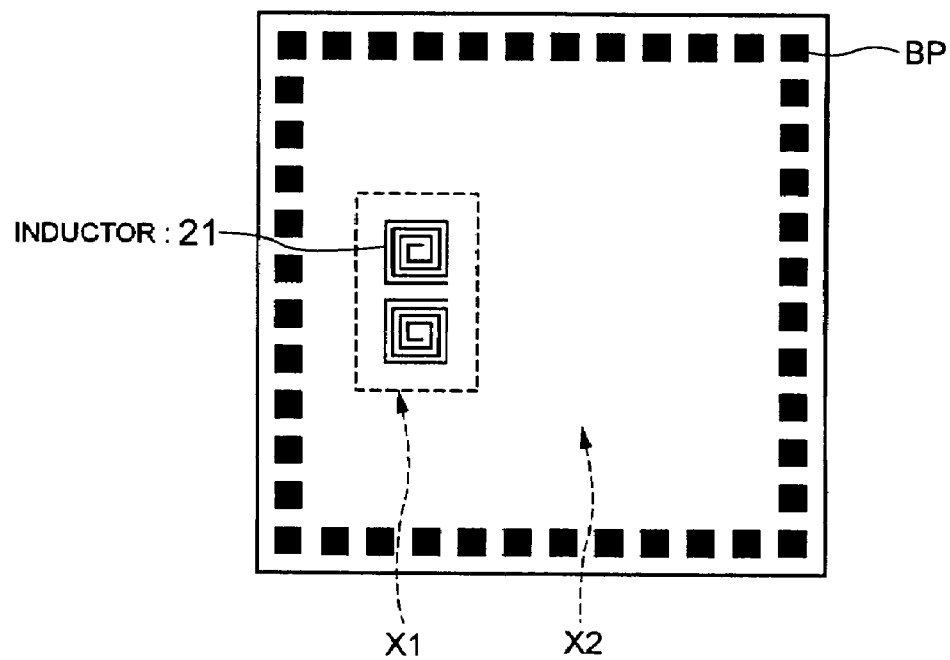
FIG. 6 is a schematic plan view of a semiconductor device according to a second embodiment of the present embodiment, to particularly show the position of an inductor and the shape of a support substrate.
Figure 7:
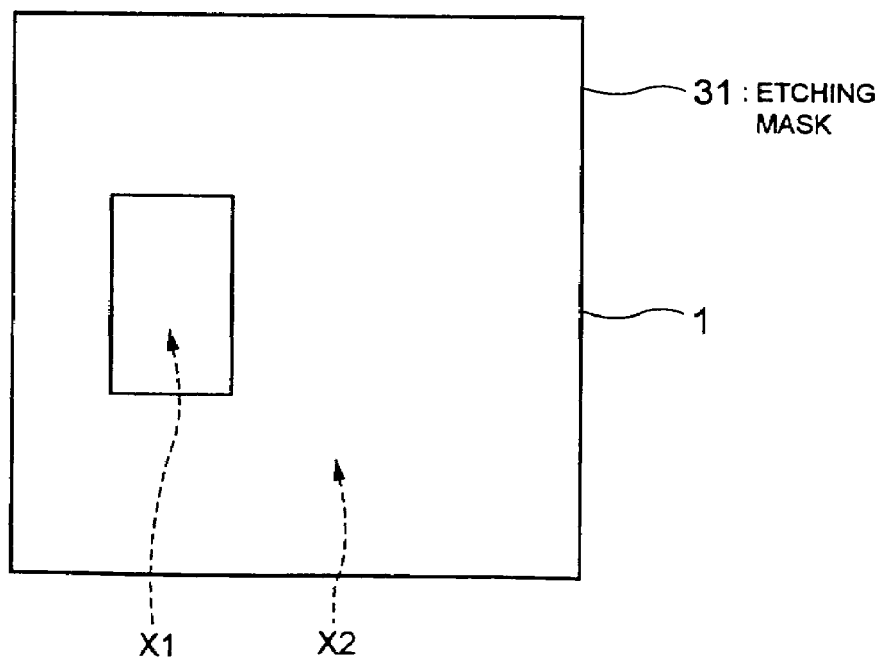
FIG. 7 is a schematic bottom view of the semiconductor device of FIG. 6 to show the shape of the semiconductor device and the shape of an etching mask used in the fabrication of this semiconductor device.

FIG. 6 is a plan view of the semiconductor device 200 that includes an inductor 21, i.e., a target element. A first region X1 that includes the inductor 21 and a second region X2 excluding this region are defined in the semiconductor device 200. FIG. 7 is a bottom view of the semiconductor device 200 during the fabrication process, when an etching mask 31 is placed. As shown in FIG. 7, the etching mask 31 is formed on the reverse face of the support substrate 1 to cover only the area located below the second region X2. Next, the support substrate 1 is subjected to etching by using the etching mask 31. The support substrate 1 in the area located below the first region X1, that is, the inductor 21, is removed via the above process, such that the groove G is formed in this position.

When the groove G is formed below the first region X1, the dielectric loss of the inductor 21 which is the target element is reduced. Accordingly, high speed operation and stability of the semiconductor device 200 are ensured in response to a high frequency signal.

As mentioned earlier, in a case where target elements requiring dielectric loss reduction are widely distributed throughout the semiconductor device, the formation area of the groove G is also broad. One or more grooves G may be formed. In this case, particularly when determining the formation area of the groove(s) G, consideration is preferably paid to the balance between the dielectric loss reduction and the strength of the semiconductor device 200. If groove G is formed in a very wide area, there is a risk of a drop in the strength of the support substrate 1. The groove G is preferably not located at least directly below the bonding pads BP. In the semiconductor device fabrication process, the wire bonding performed on the bonding pads BP exerts the largest amount of mechanical stress on the semiconductor device. In this respect, by placing (leaving, maintaining) the support substrate 1 below the bonding pads BP (not forming the groove G), a situation where the device is damaged by the wire bonding processing is avoided.

THIRD EMBODIMENT:

A fabrication method for a semiconductor device 300 that includes a plurality of elements will be described with reference to FIGS. 8 and 9. This fabrication method is particularly suitable for the semiconductor device 300 in which target elements whose dielectric loss is to be reduced are dispersed throughout the semiconductor device.

Figure 8:
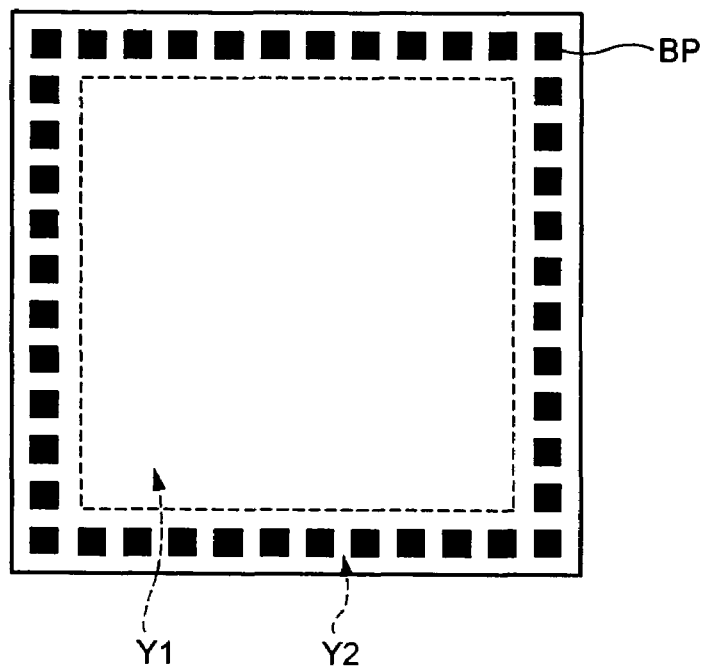
FIG. 8 is a plan view of a semiconductor device according to a third embodiment of the present invention, to particularly show the position of a bonding pad and the shape of a support substrate.
Figure 9:
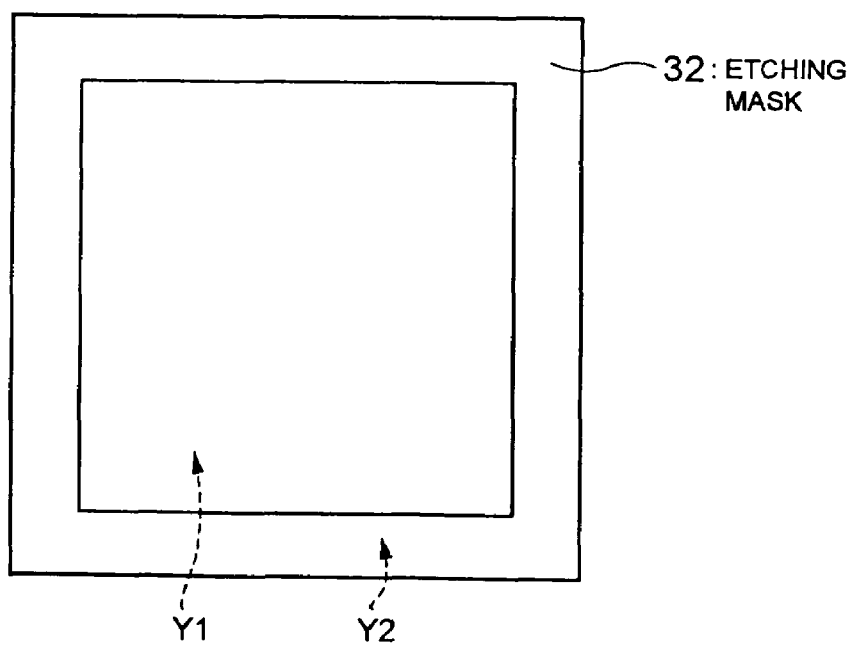
FIG. 9 is a schematic bottom view of the semiconductor device of FIG. 8 to show the shape of the semiconductor device and the shape of an etching mask used in the fabrication of this semiconductor device.

FIG. 8 is a plan view of the semiconductor device 300. The bonding pads BP are formed along the periphery (edge) of the semiconductor device 300. First, a second region Y2 that includes the bonding pads BP and a first region Y1 excluding this region are defined in the semiconductor device 300. FIG. 9 is a bottom view of the semiconductor device 300 during the fabrication process when an etching mask 32 is placed. As shown in FIG. 9, the etching mask 32 is formed on the reverse face of the support substrate 1 such that the etching mask 32 covers, of the whole of the back face of the support substrate 1, only the area located below the second region Y2. Next, the support substrate 1 is subjected to etching using the etching mask 32. As a result of the above process, the support substrate 1 located below the first region Y1 is removed, and the support substrate 1 remains in the area located below the second region Y2, that is, below the bonding pads BP. Consequently, the groove G is formed in a position which corresponds with the first region Y1.

According to the semiconductor device 300 having the groove G formed below the first region Y1, the dielectric loss of a multiplicity of widely distributed elements can be reduced. The strength (rigidity) of the semiconductor device 300 is also maintained.

Figure 10:
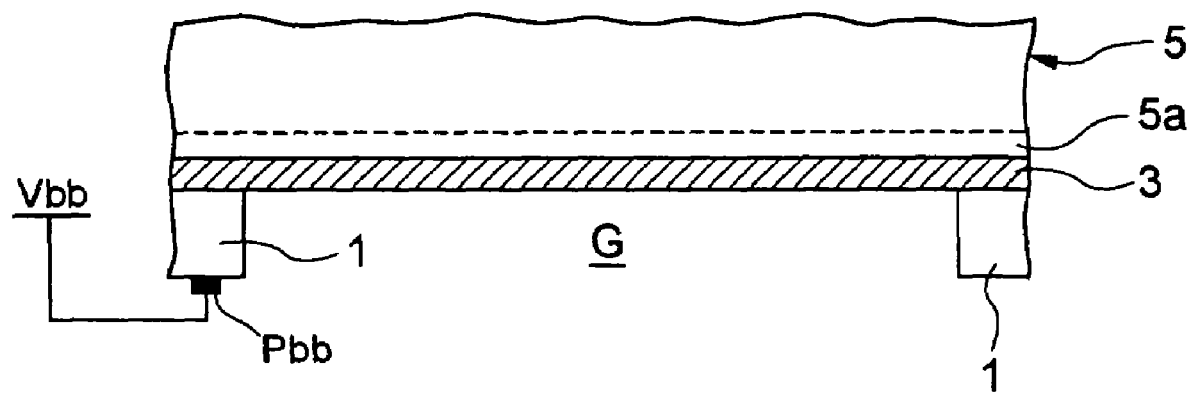
FIG. 10 is a cross-sectional view of the semiconductor device showing a method for applying a bias voltage to the support substrate.

It is sometimes necessary to apply a bias voltage to the support substrate in accordance with the electrical specifications of the semiconductor device. In this respect, although each of the semiconductor devices 100, 200, 300 has the groove G formed in the support substrate 1 in order to reduce the dielectric loss of the target element, a bias voltage can be applied to the support substrate 1 because the support substrate 1 is not removed completely. The bias voltage can be applied to the support substrate 1 which has the groove G by providing a pad Pbb directly on the support substrate 1 as shown in FIG. 10. In this case, a substrate bias voltage Vbb is applied to the pad Pbb from the reverse face side of the semiconductor device 100 (200, 300). Alternatively, a via hole (not shown) that passes through the element formation layer group 5 and the BOX layer 3 may be formed and the substrate bias voltage Vbb may be applied from the front surface side of the semiconductor device to the support substrate 1 via this via hole.

According to the fabrication method of the semiconductor device 100, 200, 300 of any of the above described embodiments, because the groove G is appropriately formed in the support substrate 1, it is possible to fabricate the semiconductor device that includes an element having a reduced dielectric loss. By selecting one, two or more elements from among a plurality of elements belonging to the semiconductor device as a target element or target element group, the dielectric loss of this target element or target element group can be reduced.

The steps of general silicon semiconductor device fabrication methods for which fabrication techniques have already been established can be incorporated as is into the semiconductor device fabrication method of the above described embodiments. Therefore, the costs involved in fabricating the semiconductor device are kept low. In addition, it is possible to form a high frequency module that includes a target element group for which dielectric loss is reduced, and to form a functional element block that includes a CMOS device group by using general silicon semiconductor device fabrication methods, on a single substrate. If mixing of the CMOS device group and the high frequency module is performed, a greater variety of functions is then created.

Embodiments of the present invention have been described with reference to the attached drawings but the present invention is not limited to these embodiments. It is obvious to those skilled in the art that a variety of modified examples or revised examples are conceivable within the realm of technological ideas defined by the appended claims and that such examples may naturally also be understood as belonging to the technological scope of the present invention.

For example, the groove G is formed in only one location in the entire support substrate 1 in the illustrated embodiments, but a plurality of grooves can be formed in the single support substrate 1.

Although a predetermined area of the support substrate 1 is removed until the BOX layer 3 is exposed in the illustrated embodiments, the depth of the groove G can be determined by considering the extent of the reduction in the dielectric loss. In a case where the performance of the semiconductor device seems to decrease when the BOX layer 3 is exposed or the exposed face of the BOX layer 3 is etched only a little, etching of the support substrate 1 is preferably stopped before the BOX layer 3 is exposed.

It should also be noted that the support substrate 1 is not limited to a silicon substrate. For example, a sapphire substrate may be used instead of the silicon substrate.

This application is based on Japanese Patent Application No. 2003-40333, and the entire disclosure thereof is incorporated herein by reference.

What is claimed is:

1. A non-optical electronic semiconductor device comprising:
   a sapphire support substrate including at least one groove;
   a first insulation layer on top of the support substrate;
   an SOI layer formed on top of the first insulation layer;
   a first element layer formed on the SOI layer,
   wherein the at least one groove extends below a target element in the first element layer whose dielectric loss is to be controlled;
   a second insulation layer formed on top of the first element layer; and
   at least one additional element layer formed on top of the second insulation layer.

2. The semiconductor device according to claim 1, wherein the at least one groove is formed such that a lower face of the first insulation layer is exposed.

3. The semiconductor device according to claim 1, wherein the target element is an analog element.

4. The semiconductor device according to claim 3, wherein the analog element is an inductor.

5. A non-optical electronic semiconductor device comprising:
   a sapphire support substrate including at least one groove;
   a first insulation layer formed on the support substrate;
   an SOI layer formed on the first insulation layer;
   a plurality of analog elements formed on the SOI layer,
   wherein the at least one groove extends below one or more analog elements among the plurality of analog elements;
   a second insulation layer formed over the plurality of analog elements; and
   at least one additional element layer formed on top of the second insulation layer.

6. The semiconductor device according to claim 5, wherein the groove is formed such that a lower face of the first insulation layer is exposed.

7. The semiconductor device according to claim 5, wherein the one or more analog elements are inductors.

8. The semiconductor device according to claim 5, wherein the one or more analog elements are elements for which control of dielectric loss is sought, among the plurality of analog elements.

9. A non-optical electronic semiconductor device comprising:
   a support substrate including at least one groove;
   a first insulation layer on top of the support substrate;
   an SOI layer formed on top of the first insulation layer;
   a first element layer formed in a first-element area on the SOI layer,
   wherein the at least one groove extends below a target element in the first element layer whose dielectric loss is to be controlled;
   a second insulation layer formed on top of the first element layer; and
   at least one additional element layer formed on top of the second insulation layer;
   the substrate further comprising a plurality of bonding pads surrounding the first-element area; and
   wherein no groove is formed below the plurality of bonding pads.

10. The semiconductor device according to claim 9, wherein the target element is a high-frequency circuit.

11. The semiconductor device according to claim 9, wherein the support substrate is a sapphire substrate.

12. The semiconductor device according to claim 9, wherein the at least one groove is formed such that a lower face of the first insulation layer is exposed.

13. The semiconductor device according to claim 9, wherein the target element is an analog element.

14. The semiconductor device according to claim 13, wherein the analog element is an inductor.

15. The semiconductor device according to claim 9, wherein the at least one groove extends below the entire first-element area, whereby the groove extends below target elements and other elements in the first-element area, except for the bonding pads, whereby rigidity of the support substrate is maintained.

16. A non-optical electronic semiconductor device comprising:
   a support substrate including at least one groove;
   a first insulation layer formed on the support substrate;
   an SOI layer formed on the first insulation layer;
   a plurality of analog elements formed in an analog-element area on the SOI layer,
   wherein the at least one groove extends below one or more analog elements among the plurality of analog elements;

a second insulation layer formed over the plurality of analog elements; and at least one additional element layer formed on top of the second insulation layer;

the substrate further comprising a plurality of bonding pads surrounding the analog-element area; and wherein no groove is formed below the plurality of bonding pads.

17. The semiconductor device according to claim 16, wherein said one or more analog elements are inductors.

18. The semiconductor device according to claim 16, wherein said one or more analog elements are elements for which control of dielectric loss is sought.

19. The semiconductor device according to claim 16, wherein the support substrate is a sapphire substrate.

20. The semiconductor device according to claim 16, wherein the at least one groove extends below the entire analog-element area, whereby the groove extends below analog elements and other elements, except for the bonding pads, whereby rigidity of the support substrate is maintained.

* * * * *